(12) United States Patent
Cheng et al.

(10) Patent No.: US 7,878,818 B2
(45) Date of Patent: Feb. 1, 2011

(54) ELECTRICAL SOCKET HAVING CONTACT TERMINALS ARRANGED IN FAN-OUT PITCH ARRANGEMENT

(75) Inventors: Chih-Pi Cheng, Tu-Cheng (TW); Jia-Hau Liu, Tu-Cheng (TW)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 12/625,414

(22) Filed: Nov. 24, 2009

(65) Prior Publication Data
US 2010/0291774 A1 Nov. 18, 2010

(30) Foreign Application Priority Data
May 18, 2009 (TW) .................................. 98208588

(51) Int. Cl.
*H01R 12/00* (2006.01)
(52) U.S. Cl. .......................... 439/66; 439/591; 439/862
(58) Field of Classification Search .................. 439/66, 439/91, 591, 862
See application file for complete search history.

(56) References Cited

U.S. PATENT DOCUMENTS

| 6,790,057 | B2* | 9/2004 | DelPrete et al. ................. 439/91 |
| 7,074,048 | B2 | 7/2006 | Liao et al. |
| 7,473,102 | B2* | 1/2009 | Colgan et al. ................. 439/66 |
| 7,625,217 | B1* | 12/2009 | Liao ............................. 439/66 |
| 7,775,805 | B2* | 8/2010 | Liao et al. ..................... 439/66 |
| 2004/0203261 | A1* | 10/2004 | DeFord et al. ................. 439/66 |
| 2009/0253287 | A1* | 10/2009 | Polnyi et al. ................. 439/331 |
| 2009/0280689 | A1* | 11/2009 | Lin et al. ..................... 439/625 |
| 2009/0311900 | A1* | 12/2009 | Liao ............................ 439/331 |

* cited by examiner

*Primary Examiner*—James Harvey
(74) *Attorney, Agent, or Firm*—Andrew C. Cheng; Wei Te Chung; Ming Chieh Chang

(57) ABSTRACT

An LGA socket used for connecting a chip module and a print circuit board includes an insulative housing and a number of terminals received in the housing. The housing has a top surface and a bottom surface opposite to each other. Each of the terminals includes an upper arm extending beyond the top surface of the housing and a lower arm extending beyond the bottom surface of the housing. The upper arms and the lower arms of the terminals extend from the base portion with different lengths so as to form different pitches at top and bottom surfaces of the housing.

20 Claims, 5 Drawing Sheets

ELECTRICAL SOCKET HAVING CONTACT TERMINALS ARRANGED IN FAN-OUT PITCH ARRANGEMENT

BACKGROUND OF THE INVENTION

1. Field of the Invention

The present invention relates to an electrical socket, and more particularly to a land grid array (LGA) socket having contact terminals having contact engaging portion with uniformed pitch, and tail portion with variable pitches different to the contact engaging portion.

2. Description of Related Art

Electrical sockets includes land grid array (LGA) sockets, ball grid array (BGA) sockets and pin grid array (PGA) sockets in accordance with the contacting between terminals and a central processing unit (CPU) or a printed circuit board (PCB).

A CPU socket disclosed in U.S. Pat. No. 7,074,048 issued to Cheng on Jul. 11th, 2006 includes an insulative housing having a plurality of passageways equidistantly arrayed thereon and a plurality of conductive terminals received in the passageways of the housing, respectively. Each terminal includes a base portion, an elastic arm and a solder portion extending from opposite sides of the base portion, and a contacting portion located at a free end of the elastic arm. The solder portion has a solder ball attached thereon. The pitch of the contacting portions is equal to the pitch of the solder portions after the terminals are assembled in the housing. The socket achieves the electrical connecting between the CPU and the PCB by soldering the solder portions of the terminals to pads of the PCB and the contacting between the contacting portions and pads of the CPU.

With the trend toward miniaturization in computer technology, the LGA socket becomes more smaller while more and more contact terminals are arranged within a single socket. Due to the difference between the CPU technology and the PCB technology, new processes can obtain small pitches of the pads on the CPU. However, manufacturing the PCB having the same pad pitches with the CPU needs higher costs, and the yield of the finished products is low. The LGA socket which can only electrically connect the CPU and the PCB with the same pitches limits the development of the CPU having fine pitch pads. Additionally, using solder balls to electrically connecting with the PCB also increases the height of the CPU socket.

In view of the above, an improved CPU socket for electrically connecting the CPU with the PCB with different pitches is needed.

SUMMARY OF THE INVENTION

Accordingly, an object of the present invention is to provide an LGA socket for electrically connecting a CPU and a PCB having pads with different pitches and reducing the overall height thereof.

According to one aspect of the present invention, an LGA socket comprises an insulative housing having a top surface and a bottom surface opposite to each other and defining a plurality of passageways arranged with two different pitches; and a plurality of terminals received in said passageways. Each terminal has a base portion, an upper arm and a lower arm extending from opposite ends of the base portion and to a same side thereof. The upper arm extends beyond the top surface of the housing and the lower arm extends beyond the bottom surface of the housing. The upper arm and the lower arm of the terminals extend from the base portion with different lengths whereby make the upper arms and lower arms of terminals form different pitches at the top and bottom surfaces of the insulative housing, respectively.

Other objects, advantages and novel features of the invention will become more apparent from the following detailed description when taken in conjunction with the accompanying drawings, in which:

BRIEF DESCRIPTION OF THE DRAWINGS

FIG. 3 is a perspective view of the terminals in the same row shown in

FIG. 1;

DETAILED DESCRIPTION OF THE INVENTION

Reference will now be made to the drawings to describe the present invention in detail.

FIGS. 1-5 illustrate an LGA socket 100 in accordance to a preferred embodiment of the present invention, which is generally used for connecting a CPU 3 to a PCB 4. The LGA socket 100 includes an insulative housing 1 having a plurality of terminals 2 received therein. The CPU 3 and the PCB 4 both define a plurality of pads 30, 40.

Figure 1:
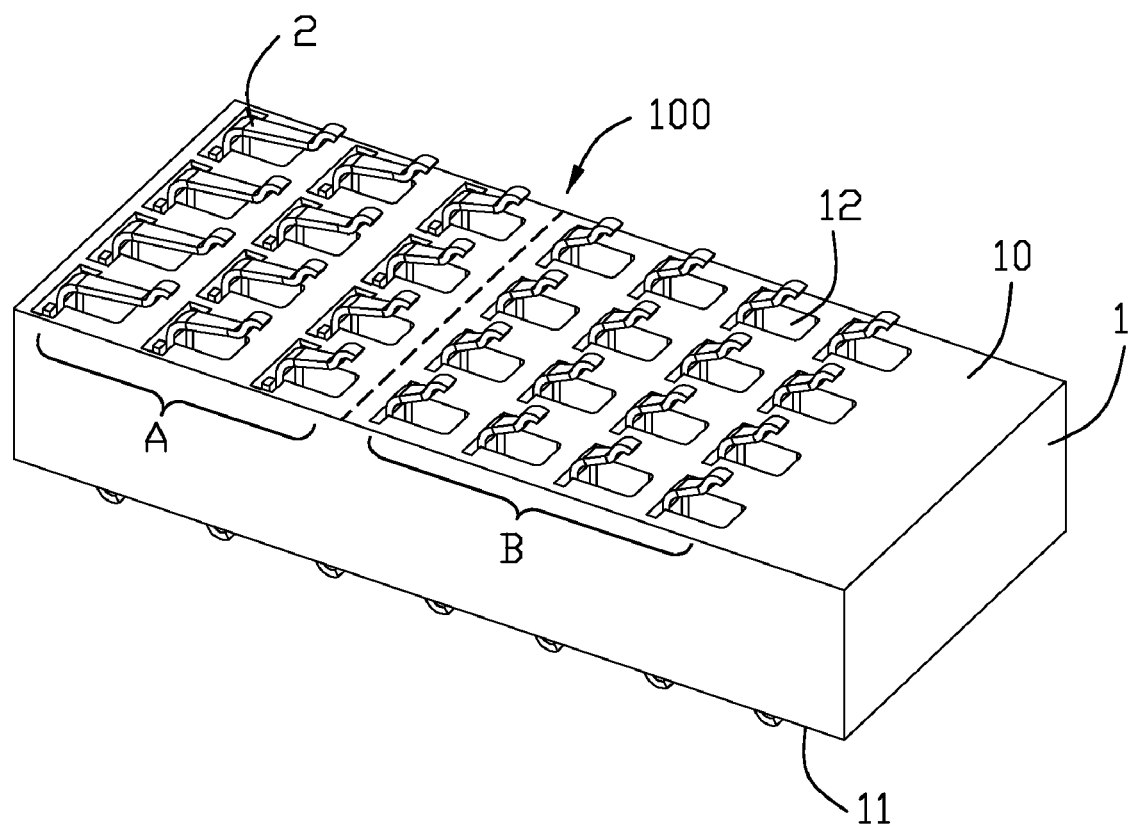
FIG. 1 is a perspective view of an LGA socket in accordance with a preferred embodiment of the present invention.
Figure 2:
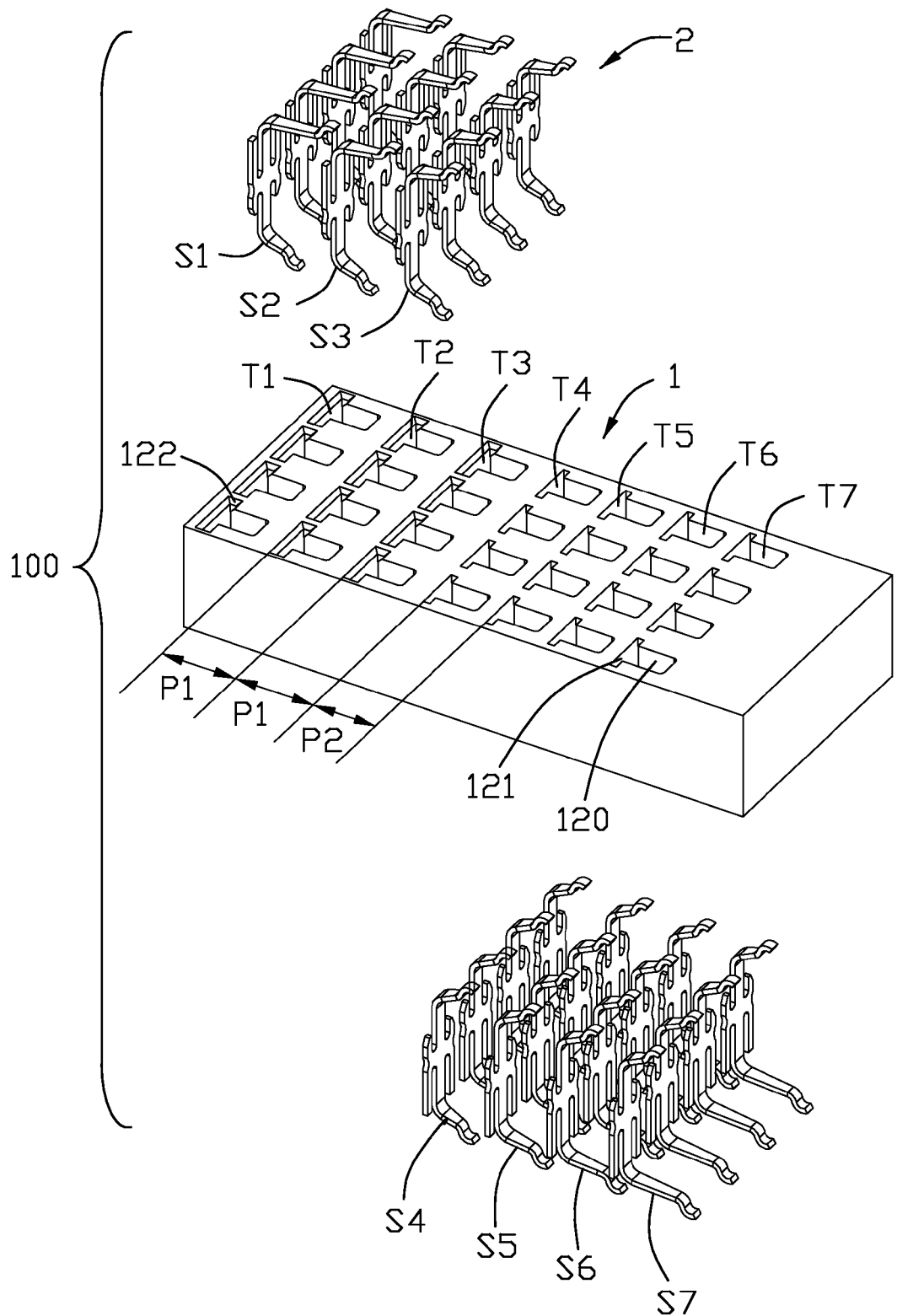
FIG. 2 is an exploded, perspective view of the LGA socket shown in FIG. 1.

Referring to FIGS. 1 and 2, the insulative housing 1 made of insulative material and having a planar structure. The insulative housing 1 includes a top surface 10, a bottom surface 11 opposite thereto and defines a plurality of passageways 12 extending from the top surface 10 to the bottom surface 11 and arranged in rows. Each passageway 12 has a receiving hole 120 and a retaining slot 121 communicating with the receiving hole 120 and located at one side of the receiving hole 120. The retaining slot 121 is used to retain the terminals 2 in the insulative housing 1 and has a plurality of inclined guiding surface 122 for guiding the terminal 2 attached to the insulative housing 1. The passageways 12 located in the longitudinal row are designated as a passageway group (not labeled) which includes seven passageways 12 which are marked with T1 to T7 one by one. The housing 1 is divided into two areas respectively marked with A and B.

The passageways T1 to T3 of a passageway group belongs to area A, and the passageways T4 to T7 belongs to area B. The guiding surface 122 of the passageways T1 to T3 in area A are located at the top surface 10 for guiding the terminals 2 attached to the insulative housing 1 in an up to down direction. While the guiding surface 122 of the passageways T4 to T7 in area B are located at the bottom surface 11 of the insulative housing 1 for guiding the terminals 2 into the insulative housing 1 in a down to up direction. The pitch P1 of the retaining slot 121 in area A is larger than the pitch P2 of the retaining slot 121s in area B. The distance between the retaining slot 121 of the passageway T3 in area A and the retaining slot 121 of the passageway T4 in area B is equal to the pitch P1.

Figure 3:
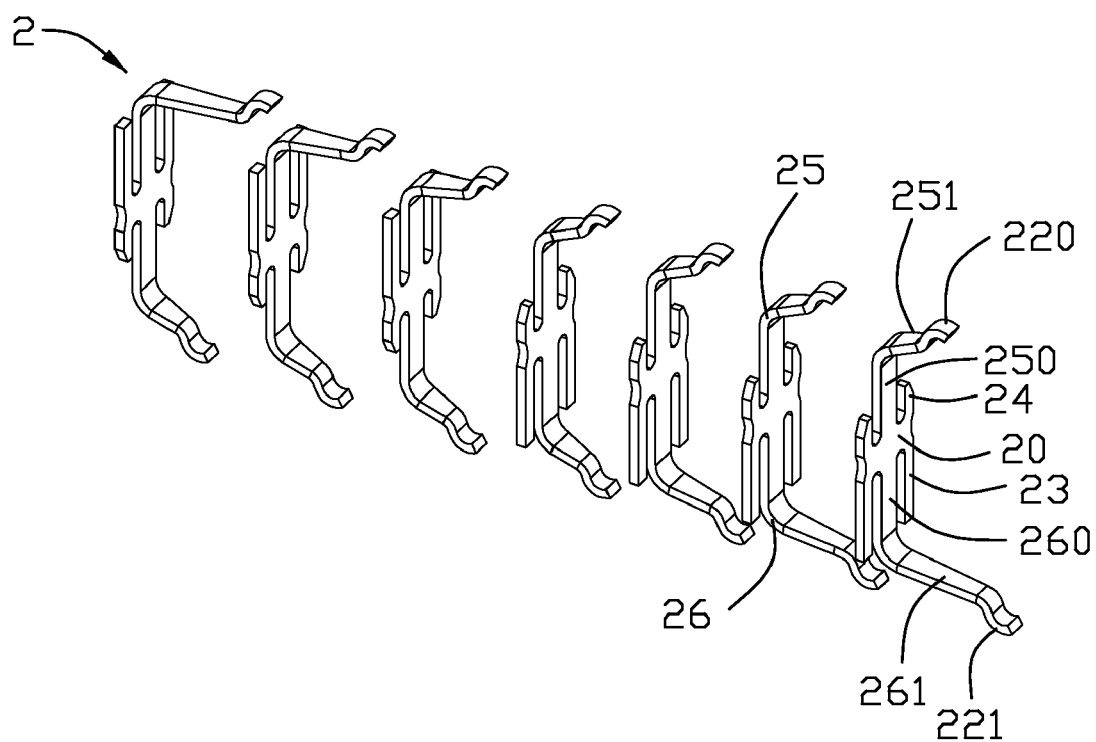
Figure 4:
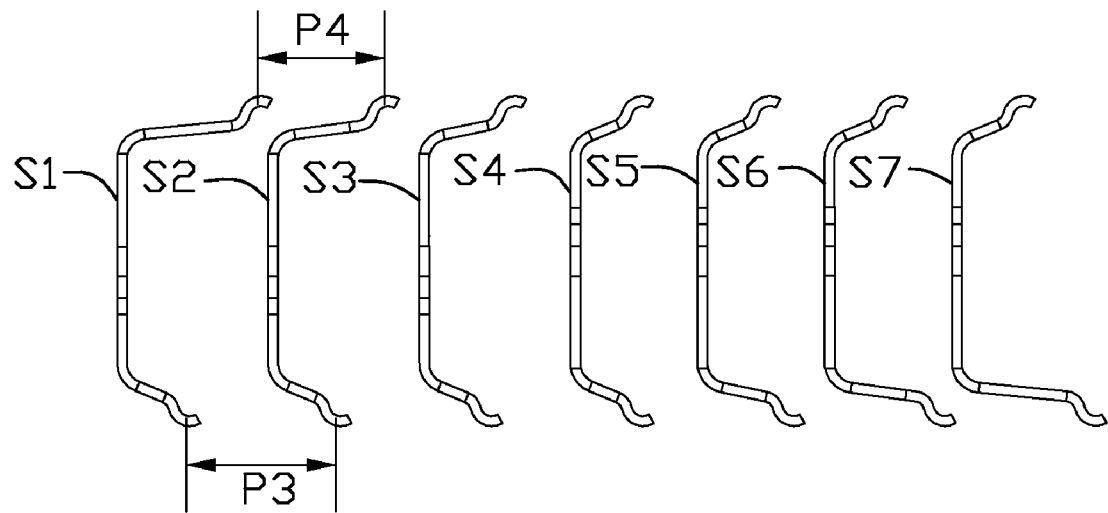
FIG. 4 is a front view of the terminals shown in FIG. 3.
Figure 5:
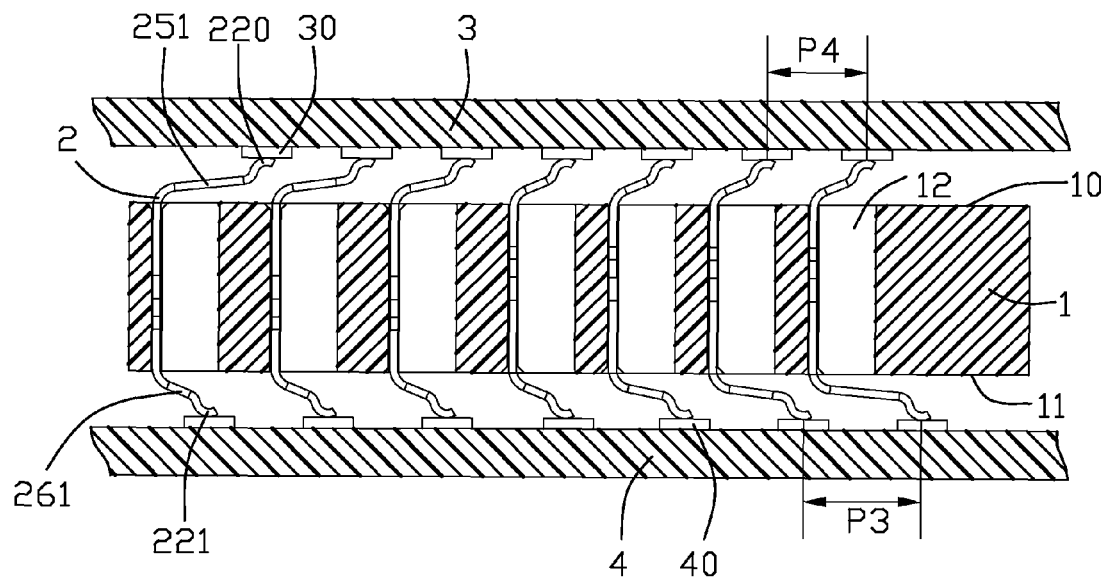
FIG. 5 is a sketch view showing the LGA socket establishing electrical connection between a CPU and a PCB.

Referring to FIG. 3 to FIG. 5, the terminal 2 stamped from metallic material includes a base portion 20, a pair of elastic arms bending from a middle portion of the base portion 20, a holding portion 23 and a guiding portion 24 respectively extending from opposite ends of the base portion 20 in a vertical direction. The pair of elastic arms includes an upper arm 25 extending upwardly from the base portion 20 and a lower arm 26 extending downwardly from the base portion 20. The upper arm 25 has a first arm portion 250 extending upwardly from the base portion 20 and a first extending portion 251 extending obliquely from an end of the first arm portion 250. The first extending portion 251 extends beyond the top surface 10 of the insulative housing 1. The lower arm 26 has a lower arm portion 260 extending downwardly from the base portion 20 and a second extending portion 261 extending obliquely from an end of the lower arm portion 260 and beyond the bottom surface 11 of the insulative housing 1. The length of the first arm portion 250 is the same with that of the second first arm portion 260. A first contacting portion 220 is arc shaped and formed at free end of the first extending portion 251 for contacting with the pad 30 of the CPU 3. A second contacting portion 221 is also arc shaped and formed at free end of the second extending portion 261 for contacting with the pad 40 of the PCB 4. The holding portion 23 extending vertically from two sides of the base portion 20 can match with the retaining slot 121 of the insulative housing 1 to retain the terminal 2 therein. The base portion 20, the holding portion 23 and the guiding portion 24 are disposed in a same vertical plane.

The terminals 2 received in the insulative housing 1 are also arranged in different rows either in the transversal direction or in the longitudinal. The terminals in the longitudinal row are designated as a terminal group and include two types of terminals 2 which are arranged side by side and have an identical structure. Each group has seven terminals numbered one by one with S1 to S7 from left to right. The terminals S1 to S7 can be divided into two types according to the assembling direction thereof. The terminals S1 to S3 are received in the passageways T1 to T3 in area A one by one and attached to the insulative housing 1 from a top surface 10. The terminals S4 to S7 received in the passageways T4 to T7 one by one and attached to the insulative housing 11 from the bottom surface 11. The holding portions 23 of the terminals S1 to S3 extend upwardly from the base portions 20, and the guiding portions 24 of the terminals S1 to S3 extend downwardly from the base portions 20 for guiding the terminals S1 to S3 into the passageways T1 to T3. The length of the first extending portion 251 of the terminals S1 to S3 is longer than the length of the second extending portion 261 of the same terminal 2. The lengths of the first extending portions 251 of the terminals S1 to S3 are reduced gradually one by one from left to right. The lengths of the second extending portions 261 of terminals S1 to S3 are the same from left to right. Because the pitch P1 of area A is the same, a pitch P4 between the first contacting portions 220 of the adjacent terminals 2 in the left portion is the same, a pitch P3 between the second contacting portions 221 of the adjacent terminals 2 in the left portion is also the same. The pitch P4 is smaller than the pitch P3, and the difference between the pitch P3 and the pitch P4 is equal to the difference between the pitch P1 and the pitch P2. That is to say that P3 minus P4 equal to P1 minus P2.

While the holding portions 23 of the terminals S4 to S7 all extend downwardly from the base portions 20. The guiding portions 24 of the terminals S4 to S7 extend upwardly from the base portions 20 for guiding the terminals S4 to S7 into the passageways T4 to T7 from the bottom surface 11. The lengths of the first extending portion 251 and the second extending portion 261 of the terminal S4 are equal. The length of the first extending portion 251 of the terminals S5 to S7 is shorter than the length of the second extending portion 261 of the same terminals S5 to S7. The lengths of the first extending portions 251 of the terminals S4 to S7 are the same, and the lengths of the second extending portions 261 of the terminals S4 to S7 are increased one by one from left to right. Because the pitch P2 of the passageways 12 in B area is the same, the pitch between the adjacent first contacting portions 220 of the terminals S4 to S7 is the same, and the pitch between the adjacent second contacting portions 221 of the terminals S4 to S7 is also the same.

In addition, the lengths of the first extending portions 251 of the terminals S1 to S4 are respectively equal to the lengths of the second extending portions 261 of the terminals S7 to S4. The lengths of the second extending portions 261 of the terminals S1 to S4 are respectively equal to the lengths of the first extending portions 251 of the terminals S7 to S4. So that the lengths of the first extending portions 251 of the terminals S1 to S4 in the same terminal group are reduced one by one from left to right, the lengths of the second extending portions 261 of the terminals S4 to S7 in the same terminal group are increased one by one from left to right.

Because the pitch P2 between the retaining slot 121 of the passageways T4 to T7 is shorter than the pitch P1 between the retaining slot 121 of the passageways T1 to T4, the first contacting portions 220 of the terminals S4 to S1 are gradually and closely arranged and the second contacting portions 221 of the terminals S4 to S7 are gradually diffusely after the terminals S1-S7 secured to the insulative housing 1. By the pitch compensation of the passageways T4 to T7, the pitch of the first contacting portions 220 of the terminals S4 to S7 and the pitch of the second contacting portions 221 of the terminals S4 to S7 are respectively equal to the pitch P4 and the pitch P3, which is also described as P4=P3+P2−P1. So the pitches of the first contacting portions 220 of all the terminals S1 to S7 are the same and equal to the pitch P4, and the pitches of the second contacting portions 221 of the terminals S1 to S7 are also the same and equals to the pitch P3. Then, the LGA socket 100 can electrically connect the CPU 3 and the PCB 4 with different pad pitches.

The LGA socket 100 can electrically connect the CPU 3 having fine pad pitches and the PCB 4 having coarse pad pitches. In addition, the LGA socket 100 achieves the electrical connection between the CPU 3 and the PCB 4 through the first contacting portions 220 abutting against the pads 30 of the CPU 3 and the second contacting portions 221 abutting against the pads 40 of the PCB 4 rather than solder balls also reducing the height of the LGA socket 100.

It is also can be seen that the top and lower arms 250, 260 of the central terminals S4 of the terminals S1-S7 extend from the base portion 20 with the same length, and the top and lower arms 250, 260 of the terminals S1, S2, S3, S5, S6, S7 extend from the base portion 20 with different lengths. Furthermore, the terminals S1, S2, S3 are essentially similar to the terminals S7, S6, S5, respectively. Therefore, the manufacture process of the terminals is also facilitated.

While the preferred embodiments in accordance with the present invention has been shown and described, equivalent modifications and changes known to persons skilled in the art according to the spirit of the present invention are considered within the scope of the present invention as defined in the appended claims.

What is claimed is:

1. An LGA (land grid array) socket for connecting a CPU (central processing unit) and a PCB (printed circuit board) comprising:

an insulated housing having a top surface and a bottom surface opposite to each other and defining a plurality of passageways arranged with two pitches; and a plurality of terminals received in said passageways and each having a base portion, an upper arm and a lower arm extending from opposite ends of the base portion and extending in the same direction with respect to the base portion, the upper arm extending beyond the top surface of the housing and the lower arm extending beyond the bottom surface of the housing;

wherein the upper arm and the lower arm of the terminals extend from the base portion with different lengths, the different lengths making the upper arms and lower arms of terminals form different pitches at the top and bottom surfaces of the insulated housing, respectively.

2. The LGA socket as claimed in claim 1, wherein said two pitches of the passageways includes a first pitch and a second pitch, and wherein the passageways of the insulated housing are divided into two areas, and wherein the passageways in one area arrange with the first pitch and the passageways in the other area with the second pitch which is smaller than the first pitch.

3. The LGA socket as claimed in claim 2, wherein the upper arm defines a first extending portion and the lower arm has a second extending portion, wherein lengths of the first extending portions of the terminals arranged in the passageways in said one area are gradually reduced one by one from left to right, and lengths of the first extending portions of the terminals arranged in the passageways in said the other area are same.

4. The LGA socket as claimed in claim 3, wherein lengths of the second extending portions of the terminals arranged in the passageways in said one area are same, and lengths of the second extending portions of the terminals arranged in the passageways in said the other area are gradually increased.

5. The LGA socket as claimed in claim 4, wherein difference between the first and second pitches is equal to the difference between the pitches formed by the lower arms and upper arms of the terminals.

6. The LGA socket as claimed in claim 5, wherein the terminals arranged in said one area are attached to the insulated housing from the top surface thereof, and the terminals arranged in said the other area are attached to the insulated housing from the bottom surface thereof.

7. The LGA socket as claimed in claim 6, wherein each passageway defines a receiving hole and a retaining slot communicating therewith, and wherein the retaining slot has a plurality guiding planes.

8. The LGA socket as claimed in claim 7, wherein the terminal also has a holding portion and a guiding portion respectively extending from the base portion in a vertical direction, wherein the holding portion and the guiding portion are located in a same plane and positioned at opposite sides of the top and lower arms.

9. An LGA (land grid array) socket for connecting a CPU (central processing unit) and a PCB (printed circuit board) comprising:

an insulated housing having a top surface and a bottom surface opposite to each other and defining a plurality rows of passageways; and a plurality rows of terminals received in the passageways and each having a base portion, an upper arm and a lower arm extending from opposite ends of the base portion, the upper arm extending beyond the top surface of the housing and the lower arm extending beyond the bottom surface of the housing;

wherein the plurality of rows of the terminals includes a central row and a plurality of side rows at opposite sides of the central row, the top and lower arms of each terminal in the central row having similar configuration, and top and lower arms of each terminals in the side rows having different configuration, the different configurations forming two different terminal pitches at the top and bottom surfaces of the insulative insulated housing, respectively.

10. The LGA socket as claimed in claim 9, wherein said rows of passageways also includes a central row for receiving the central row of terminals and a plurality of side rows corresponding to the side rows of terminals, and wherein the side rows of passageways at one side of the central row form a first pitch and the side rows of passageways at the other side of the central row form a second pitch.

11. The LGA socket as claimed in claim 9, wherein the upper arm and lower arms of each terminal are located at same side of the base portion thereof.

12. The LGA socket as claimed in claim 9, wherein the side rows of the terminals at opposite sides of the central row are attached to the insulated housing from opposite directions, respectively.

13. The LGA socket as claimed in claim 12, wherein two corresponding rows of terminals respectively located at opposite sides of central row have similar configuration.

14. An electrical connector comprising:

an insulated housing defining opposite first and second faces; one row of contacts disposed in the housing along a first direction and essentially categorized with opposite first and second half groups thereof, each of said contacts including: a base section wherein a first pitch defined between the adjacent two base sections of the neighboring contacts in the first group is different from a second pitch defined between the adjacent two base sections of the neighboring contacts in the second group;

a first contacting section extending beyond the housing and being deflectable toward the first face for abutment with a first electronic component located above the first face; and a second contacting sections extending beyond the housing and being deflectable toward the second face for abutment with a second electronic component located above the second face;

wherein the first contacting sections of the contacts in the first group have a same operation length while the second contacting sections thereof have different operation lengths with one another; and the first contacting sections of the contacts in the second group have different operation lengths while the second contacting sections thereof have a same operation length.

15. The electrical connector as claimed in claim 14, wherein when said first contacting sections and said second contacting sections are abutted against by the first electronic component and the second electronic component, respectively, a third pitch defined by the first contacting sections is different from a fourth pitch defined by the second contacting sections.

16. The electrical connector as claimed in claim 15, wherein a difference between the first pitch and the second pitch is essentially equal to that between the third pitch and the fourth pitch.

17. The electrical connector as claimed in claim 15, wherein the first contacting sections of the contacts essentially extend along said first direction from the second group toward the first group under condition that the second pitch is larger than the first pitch.

18. The electrical connector as claimed in claim 15, wherein the first contacting sections of the contacts essentially extend along said first direction from the second group toward the first group under condition that the first contacting sections of the contacts in the second group are arranged with decreasing lengths in sequence along said first direction.

19. The electrical connector as claimed in claim 15, wherein the second contacting sections of the contacts extend along the first direction from the second group toward the first group under condition that the second contacting sections of the contacts in the first group are arranged with increasing lengths in sequence along said first direction.

20. The electrical connector as claimed in claim 15, wherein the contacts in the first group are essentially similar to those in the second group while in a mirror image arrangement with each other.

* * * * *